(12) United States Patent
Daito

(10) Patent No.: US 6,977,606 B2
(45) Date of Patent: Dec. 20, 2005

(54) PIPELINED ANALOG-TO-DIGITAL CONVERTER

(75) Inventor: Mutsuo Daito, Daito (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/921,129

(22) Filed: Aug. 19, 2004

(65) Prior Publication Data

US 2005/0040982 A1 Feb. 24, 2005

(30) Foreign Application Priority Data

Aug. 22, 2003 (JP) ........................................ 2003-298494

(51) Int. Cl.[7] .............................................. H03M 1/38
(52) U.S. Cl. ...................................... 341/161; 341/162
(58) Field of Search ................................ 341/161, 162, 341/120, 118

(56) References Cited

U.S. PATENT DOCUMENTS 5,500,644 A * 3/1996 Denjean et al. ............. 341/120

6,166,675 A * 12/2000 Bright ......................... 341/162

OTHER PUBLICATIONS

Hisn–Shu Chen et al., A 14–b 10–MSample/s CMOS Pipelined ADC, IEEE Journal of Solid–State Circuits, vol. 36, No. 6, (Jun. 2001), pp. 997–1001.

* cited by examiner

Primary Examiner—Peguy JeanPierre
Assistant Examiner—Joseph Lauture
(74) Attorney, Agent, or Firm—Birch, Stewart, Kolasch & Birch, LLP

(57) ABSTRACT

An arithmetic circuit includes a sample hold portion, an adding portion, a subtracting portion, an A/D sub-converter and a D/A sub-converter. The adding portion adds first and second residual voltages provided from a preceding stage. In a first hold mode, the subtracting portion subtracts an analog voltage from a voltage produced by the addition by the adding portion, and provides a voltage produced by the subtraction as a first residual voltage in this stage to a next stage. In a second hold mode, the subtracting portion interchanges internal capacitors with each other, subtracts the analog voltage from a voltage produced by the addition by the adding portion, and provides a voltage produced by the subtraction as a second residual voltage to the next stage.

6 Claims, 16 Drawing Sheets

PIPELINED ANALOG-TO-DIGITAL CONVERTER

This nonprovisional application is based on Japanese Patent Application No. 2003-298494 filed with the Japan Patent Office on Aug. 22, 2003, the entire contents of which are hereby incorporated by reference.

BACKGROUND OF THE INVENTION

1. Field of the Invention

The present invention relates to an A/D converter (analog-to-digital converter), and particularly to a pipelined A/D converter, in which signals are sent downstream in a pipeline fashion, and A/D conversion is effected on the signals in each stage,

2. Description of the Background Art

An A/D converter is a circuit for discretizing or digitizing an analog signal, of which voltage continuously changes with time, in a time axis direction and a voltage axis direction, and thereby converting it to a binary digital signal. Such A/D converters have been widely used as interfaces in various devices.

Various manners have been proposed for discretizing the voltage of the analog signal in view of precision and conversion speed of the A/D converters. One of the known manners is executed by a pipelined A/D converter, which sends the signal downstream in a pipeline fashion, and performs A/D conversion in each stage.

FIG. 14 is a block diagram schematically showing a whole structure of a conventional pipelined A/D converter.

Referring to FIG. 14, an A/D converter 100 is formed of stages of (N−1) in number connected in a pipeline fashion, and includes arithmetic circuits 101–103 corresponding to the first to (N−1)th stages, respectively. A/D converter 100 also includes a digital error correction circuit 12, which receives bit data provided from each stage, and performs error correction processing to provide a final digital signal of N bits.

In A/D converter 100, the arithmetic circuit in each stage other than an arithmetic circuit 103 in the final stage basically performs one-bit conversion. However, redundancy of 0.5 bits is employed for providing data of 1.5 bits (ternary data) to digital error correction circuit 12. Arithmetic circuit 103 in the final stage converts the analog signal received from the preceding stage to 2-bit data, and provides it to digital error correction circuit 12.

Digital error correction circuit 12 receives the bit data provided from each stage, performs addition of the respective bit data and error processing, and finally outputs the N-bit digital signal.

In A/D converter 100, when an arithmetic circuit 101 forming a first stage receives an analog input signal Vin, arithmetic circuit 101 converts analog input signal Vin to 1.5-bit data, and provides the converted bit data to digital error correction circuit 12. Arithmetic circuit 101 doubles a residual between analog input signal Vin and a voltage corresponding to the converted bit data, and provides a doubled residual voltage Vres1 to the second stage.

When an arithmetic circuit 102 forming a second stage receives residual voltage Vres1, arithmetic circuit 102 converts it to 1.5-bit data, and provides the converted bit data to digital error correction circuit 12. Arithmetic circuit 102 doubles a residual between residual voltage Vres1 and a voltage corresponding to the converted bit data, and provides a doubled residual voltage Vres2 to a next stage.

Thereafter, the A/D conversion is performed similarly in each stage, and arithmetic circuit 103 forming the final (N−1)th stage receives a residual voltage Vres(N−2) from a preceding stage. Thereby, arithmetic circuit 103 converts residual voltage Vres(N−2) to 2-bit data, and provides the converted bit data to digital error correction circuit 12.

Based on the bit data provided from each stage, digital error correction circuit 12 performs addition of the respective data as well as the error correction, and finally provides an N-bit digital signal.

FIG. 15 is a function block diagram illustrating a structure and a function of the arithmetic circuit shown in FIG. 14. All the foregoing arithmetic circuits have the same structure, and FIG. 15 representatively shows a structure of arithmetic circuit 102. Arithmetic circuit 103 in the final stage provides the output data of 2 bits instead of the 1.5-bit output data shown in FIG. 15.

Referring to FIG. 15, arithmetic circuit 102 includes a sample hold portion 121, a subtracting portion 122, an amplifying portion 123, an A/D sub-converter 24 and a D/A sub-converter (digital-to-analog sub-converter) 25.

Sample hold portion 121 samples residual voltage Vres1 provided from arithmetic circuit 101 in the preceding stage, and holds the voltage thereof. A/D sub-converter 24 converts the residual voltage Vres1 to 1.5-bit data, and provides the converted bit data to digital error correction circuit 12 (not shown in FIG. 15).

D/A sub-converter 25 converts the data, which is converted into the digital data by A/D sub-converter 24, to an analog voltage Vr2. Subtracting portion 122 subtracts analog voltage Vr2, which is provided by D/A sub-converter 25, from voltage Vres1 held by sample hold portion 121.

Amplifying portion 123 amplifies the voltage provided from subtracting portion 122 by an amplification factor of 2, and provides the amplified voltage to a next stage as residual voltage Vres2 in the second stage.

In this manner, the voltage width of the input range of each stage can be equal to those of the other stages.

FIG. 16 is a circuit diagram showing a structure of a major portion of arithmetic circuit 102 shown in FIG. 12. FIG. 16 shows specific circuit structures of sample hold portion 121, subtracting portion 122 and amplifying portion 123 shown in FIG. 15. Although not shown in FIGS. 14 and 15, the above A/D converter practically has a circuit structure of a differential type. More specifically, analog input voltage Vin is formed of a signal VinA and a signal VinB produced by inverting signal VinA with respect to a common voltage Vcom. Residual voltage Vresi (i is a natural number from 1 to (N−2)) is formed of a voltage VresiA and a voltage VresiB produced by inverting voltage VresiA with respect to common voltage Vcom. Analog voltage Vri converted by D/A sub-converter 25 is formed of a voltage VriA and a voltage VriB produced by inverting voltage VriA with respect to common voltage Vcom.

Referring to FIG. 16, arithmetic circuit 102 includes switches S101–S108, capacitors C101–C104, differential amplifier 137, nodes ND101–ND106, input nodes 131–134 and output nodes 135 and 136.

Input nodes 132 and 133 receive residual voltages Vres1A and Vres1B provided from the preceding stages, respectively. Input nodes 131 and 134 receive analog voltages Vr2A and Vr2B provided from D/A sub-converter 25. Switch S101 is connected between input node 131 and node ND101, and switch S102 is connected between input node 132 and node ND101. Switch S103 is connected between input node 133 and node ND102, and switch S104 is connected between input node 134 and node ND102.

Switch S105 is connected between output node 135 and node ND103, and switch S106 is connected between nodes ND101 and ND103. Switch S107 is connected between nodes ND102 and ND104, and switch S108 is connected between output node 136 and node ND104.

Capacitor C101 is connected between nodes ND103 and ND105, and capacitor C102 is connected between nodes ND101 and ND105. Capacitor C103 is connected between nodes ND102 and ND106, and capacitor C104 is connected between nodes ND104 and ND106.

Differential amplifier 137 has input terminals connected to nodes ND105 and ND106, respectively, and also has output terminals connected to output nodes 135 and 136, respectively. Differential amplifier 137 amplifies a voltage difference between nodes ND105 and ND106, and provides it to output nodes 135 and 136.

Arithmetic circuit 102 has two operation modes, i.e., a "sample mode" and a "hold mode". FIG. 16 shows a state in a sample mode. In the sample mode, switches S102, S103, S106 and S107 are turned on, and the other switches are turned off. Therefore, capacitors C101 and C102 sample residual voltage Vres1A, and capacitors C103 and C104 sample residual voltage Vres1B.

FIG. 17 shows a state of arithmetic circuit 102 shown in FIG. 15 and operating in the hold mode.

In the hold mode, as shown in FIG. 17, switches S101, S104, S105 and S108 are turned on, and the other switches are turned off. Thereby, capacitors C101 and C104 operate as feedback capacitors. Thereby, output node 135 is supplied with a voltage produced by subtracting analog voltage Vr2A from residual voltage Vres1A held in each of capacitors C101 and C102, and output node 136 is supplied with a voltage produced by subtracting analog voltage Vr2B from residual voltage Vres1B held in each of capacitors C103 and C104. More specifically, residual voltages Vres2A and Vres2B provided to output nodes 135 and 136 can be expressed by the following formulas, respectively, in which capacitances are represented by the same reference characters as the corresponding capacitors, respectively.

$$Vres2A=(1+C102/C101)Vres1A-(C102/C101)Vr2A \quad (1)$$

$$Vres2B=(1+C103/C104)Vres1B-(C103/C104)Vr2B \quad (2)$$

According to the above formulas, if capacitances C101 and C102 have accurately the same magnitude, or if the capacitors C103 and C104 have accurately the same magnitude, an input voltage, i.e., residual voltage Vres1A or Vres1B is accurately doubled.

In practice, however, variations are present in magnitude or capacitance of the capacitors. Therefore, residual voltages Vres1A and Vres1B are not accurately doubled, and an error caused thereby affects the downstream stages to deteriorate precision of the A/D converter. More specifically, if an A/D converter of, e.g., 14 bits multiplies the input voltage by a factor of 1.999 in each stage due to variations in capacitors, a voltage multiplied by a factor of only $1.999^{12}$ (=4071.5) is practically input to the final stage although a voltage multiplied by a factor of $2^{12}$ (=4096) is to be ideally input thereto.

One of manners, which can overcome the above problem relating to deterioration of accuracy due to variations in capacitors, is disclosed by Hsin-Shu Chen, et al., "A 14-b 20-MSamples/s CMOS Pipelined ADC", IEEE JOURNAL OF SOLID-STATE CIRCUITS, Vol. 36, No. 6, pp. 997–1001, June, 2001.

An A/D converter employing the manner disclosed therein may also be referred as an "averaging A/D converter" hereinafter. A general structure of the averaging A/D converter is the same as that shown in FIG. 14, but differs from A/D converter 100 in structures of the arithmetic circuits in the respective stages.

FIG. 18 is a function block diagram illustrating a structure and a function of an arithmetic circuit in the averaging A/D converter. All the arithmetic circuits have the same structure. FIG. 18 representatively shows a structure of an arithmetic circuit 102A corresponding to a second stage. In a final stage, the arithmetic circuit provides 2-bit output data instead of 1.5-bit output data shown in FIG. 18.

Referring to FIG. 18, arithmetic circuit 102A includes a sample hold portion 141, a subtracting portion 142, an amplifying portion 143, an averaging portion 144, A/D sub-converter 24 and D/A sub-converter 25.

Sample hold portion 141 samples residual voltage Vres1 provided from the arithmetic circuit in the preceding stage, and holds the voltage. A/D sub-converter 24 and D/A sub-converter 25 are the same as those already described with reference to FIG. 15. Subtracting portion 142 subtracts analog voltage Vr2 converted by D/A sub-converter 25 from voltage Vres1 held by sample hold portion 141.

Amplifying portion 143 amplifies the voltage provided from subtracting portion 142 by an amplification factor of 2. The averaging A/D converter has three operation modes, i.e., "sample mode", "hold mode" and "averaging mode". In the hold mode, amplifying portion 143 amplifies the voltage provided from subtracting portion 142 by an amplification factor of 2, and averaging portion 144 samples a voltage Vout1 provided from amplifying portion 143.

In the subsequent averaging mode, amplifying portion 143 amplifies a voltage, which is arithmetically operated after interchanging the capacitors as will be described later with reference to a circuit diagram, by an amplification factor of 2, and averaging portion 144 averages an output voltage Vout2 provided from amplifying portion 143 and voltage Vout1 sampled in the hold mode. Averaging portion 144 provides the voltage thus averaged to the next stage as residual voltage Vres2 of the second stage.

FIG. 19 is a circuit diagram showing a structure of a major portion of arithmetic circuit 102A shown in FIG. 18. FIG. 19 shows specific circuit structures of sample hold portion 141, subtracting portion 142, amplifying portion 143 and averaging portion 144 shown in FIG. 18. In practice, this averaging A/D converter has a circuit structure of a differential type, similarly to conventional A/D converter 100 already described.

Referring to FIG. 19, arithmetic circuit 102A includes an amplifier circuit 102A.1 and an averaging circuit 102A.2. Amplifier circuit 102A.1 includes a structure, which is the same as that of arithmetic circuit 102 in conventional A/D converter 100 shown in FIG. 16, and further includes switches S111–S115 and nodes ND111–ND114. Averaging circuit 102A.2 includes switches S121–S125, capacitors C121–C124, a differential amplifier 138, nodes ND121–ND124 and output nodes 135 and 136.

Switch S111 is connected between nodes ND113 and ND111. Switch S112 is connected between nodes ND101 and ND111. Switch S113 is connected between nodes ND102 and ND112, and switch S114 is connected between nodes ND114 and ND112. Switch S115 is connected between nodes ND113 and ND114.

Switch S121 is connected between output node 135 and node ND121, and switch S122 is connected between nodes ND113 and ND121. Switch S123 is connected between nodes ND114 and ND122, and switch S124 is connected between output node 136 and node ND122. Switch S125 is connected between output nodes 135 and 136.

Capacitor C121 is connected between nodes ND121 and ND123, and capacitor C122 is connected between nodes ND114 and ND123, Capacitor C123 is connected between nodes ND113 and ND124, and capacitor C124 is connected between nodes ND122 and ND124.

Differential amplifier 138 has input terminals connected to nodes ND123 and ND124, respectively, and have output terminals connected to output nodes 135 and 136, respectively. Differential amplifier 138 amplifies the voltage difference between nodes ND123 and ND124, and provides it to output nodes 135 and 136.

As described above, arithmetic circuit 102A has three operation modes, i.e., "sample mode", "hold mode" and "averaging mode". FIG. 19 shows a state in the sample mode. In the sample mode, switches S102, S103, S106, S112, S113, S107 and S115 are turned on, and the other switches are turned off. Therefore, capacitors C101 and C102 sample residual voltage Vres1A, and capacitors C103 and C104 sample residual voltage Vres1B.

FIG. 20 shows a state in the hold mode of arithmetic circuit 102A shown in FIG. 18.

In the hold mode shown in FIG. 20, amplifier circuit 102A.1 enters the following state. Switches S101, S104, S105, S112, S113 and S108 are turned on, and the other switches are turned off. Thereby, capacitors C101 and C104 operate as feedback capacitors, and capacitors C102 and C103 operate as capacitors sampling analog voltages Vr2A and Vr2B, respectively.

Node ND113 is supplied with a voltage produced by subtracting analog voltage Vr2A sampled by capacitor C102 from residual voltage Vres1A held by each of capacitors C101 and C102, and node ND114 is supplied with a voltage produced by subtracting analog voltage Vr2B sampled by capacitor C103 from residual voltage Vres1B held by each of capacitors C103 and C104. More specifically, voltages Vout1A and Vout1B provided to nodes ND113 and ND114 in the hold mode can be expressed by the following formulas, respectively, in which capacitances are represented by the same reference characters as the corresponding capacitors, respectively.

$$Vout1A = (1+C102/C101)Vres1A - (C102/C101)Vr2A \quad (3)$$

$$Vout1B = (1+C103/C104)Vres1B - (C103/C104)Vr2B \quad (4)$$

In averaging circuit 102A.2, switches S122 and S123 are turned on, and switches S121 and S124 are turned off. Thereby, capacitors C121 and C123 sample voltage Vout1A provided from amplifier circuit 102A.1 in the hold mode, and capacitors C122 and C124 sample voltage Vout1B.

FIG. 21 shows a state in the averaging mode of arithmetic circuit 102A shown in FIG. 18.

In the averaging mode shown in FIG. 21, amplifier circuit 102A.1 enters the following state. Switches S101, S104, S106, S111, S114 and S107 are turned on, and the other switches are turned off. Thereby, capacitors C102 and C103 operate as feedback capacitors, and capacitors C101 and C104 operate as capacitors sampling analog voltages Vr2A and Vr2B, respectively. Thus, in the averaging mode, the capacitors in amplifier circuit 102A.1 are interchanged with respect to those in the hold mode.

Node ND113 is supplied with a voltage produced by subtracting analog voltage Vr2A sampled by capacitor C101 from residual voltage Vres1A held by each of capacitors C101 and C102, and node ND114 is supplied with a voltage produced by subtracting analog voltage Vr2B sampled by capacitor C104 from residual voltage Vres1B held by each of capacitors C103 and C104. More specifically, voltages Vout2A and Vout2B provided to nodes ND113 and ND114 in the averaging mode can be expressed by the following formulas, respectively.

$$Vout2A = (1+C101/C102)Vres1A - (C101/C102)Vr2A \quad (5)$$

$$Vout2B = (1+C104/C103)Vres1B - (C104/C103)Vr2B \quad (6)$$

In averaging circuit 102A.2, switches S121 and S124 are turned on, and switches S122 and S123 are turned off. Thereby, voltages Vout1A and Vout1B sampled in the hold mode and voltages Vout2A and Vout2B provided from amplifier circuit 102A.1 in the averaging mode are averaged. More specifically, residual voltages Vres2A and Vres2B provided to output nodes 135 and 136 can be expressed by the following formulas, respectively.

$$Vres2A = (1/2)\{(1+C102/C101)+(1+C101/C102)\}Vres1A - \quad (7)$$
$$(1/2)(C102/C101+C101/C102)Vr2A$$

$$Vres2B = (1/2)\{(1+C103/C104)+(1+C104/C103)\}Vres1B - \quad (8)$$
$$(1/2)(C103/C104+C104/C103)Vr2B$$

Assuming that there is a relationship of (C101=C104=C and C102=C103=C(1+α)), where α represent variations in capacitor), the formulas (7) and (8) can be expressed by the following formulas because α is usually of a small value:

$$Vres2A = 2Vres1A - Vr2A \quad (9)$$

$$Vres2B = 2Vres1B - Vr2B \quad (10)$$

α does not appear in the above formulas so that the averaging A/D converter can remove an influence by variations in capacitors.

As described above, variations in capacitors impair the conversion precision in the conventional A/D converter. However, the averaging A/D converter can remove the influence, which may be exerted by the variations in capacitors, and thus can achieve precise conversion.

However, the averaging A/D converter includes amplifier circuit 102A.1 and averaging circuit 102A.2 as shown in FIGS. 19 to 21, and therefore requires a large circuit area. Also, differential amplifier 138 in averaging circuit 102A.2 increases noises. Further, the capacitors must have large sizes for allowing an influence by noises, resulting in further increase in circuit area and increase in power consumption.

In recent years, it has been increasingly required in electronic devices to reduce power consumption for reduction in size and improvement of portability, in addition to requirement for improvement of functions, and therefore it has been severely required in the A/D converters employed in such electronic devices to reduce sizes and power consumption. Although the averaging A/D converter already described can eliminate the influence by variations in capacitors, and thus is useful in improvement of precision (and functions), it cannot achieve the required reduction in size and power consumption.

SUMMARY OF THE INVENTION

Accordingly, the invention has been developed for overcoming the above problems, and it is an object of the invention to provide an A/D converter operating with high precision and small area penalty.

Another object of the invention is to provide an A/D converter operating with high precision and low power consumption.

According to the invention, an A/D converter of a pipeline type for converting an analog signal to a digital signal, includes a plurality of arithmetic circuits arranged in accordance with a bit length of the digital signal, and connected in series; and an output circuit providing the digital signal based on bit data provided from each of the plurality of arithmetic circuits. Each of the plurality of arithmetic circuits includes an A/D sub-converter converting an input voltage received in a sample mode to the bit data, and providing the bit data, a D/A sub-converter converting the bit data to an analog voltage, a sample hold portion sampling first and second input voltages received in first and second operation modes in the sample mode, respectively, and holding the sampled first and second input voltages in first and second voltage holding portions, respectively, an adding portion adding the voltages held in the sample hold portion, and a subtracting portion subtracting the analog voltage of the bit data from a voltage produced by the addition by the adding portion, and providing a voltage produced by the subtraction to the arithmetic circuit in the next stage. The subtracting portion operates, in a third operation mode, to subtract the analog voltage from the voltage produced by the addition, and to output a voltage produced by the subtraction as the first input voltage for the next stage, and operates, in a fourth operation mode, to subtract the analog voltage from the voltage produced by the addition, with the first and second voltage holding portions interchanged with each other, and to output a voltage produced by the subtraction as the second input voltage for the next stage.

Preferably, each of the plurality of arithmetic circuits successively changes to the first to fourth operation modes in synchronization with a clock signal, and enters the first and second operation modes in accordance with the third and fourth operation modes of the arithmetic circuit in a preceding stage, respectively.

Preferably, the first and second voltage holding portions of the sample hold portion are formed of first and second capacitors, respectively.

Preferably, each of the plurality of arithmetic circuits includes a first input node receiving the first or second input voltage, a second input node receiving the analog voltage provided from the D/A sub-converter, a switch circuit arranged between the first and second input nodes and the first and second capacitors, a first node connected to terminals, on a side not connected to the switch circuit, of the first and second capacitors, an amplifier circuit having an input terminal connected to the first node, and an output node connected to an output terminal of the amplifier circuit. The output terminal of the amplifier circuit is connected to the switch circuit. In the first operation mode, the switch circuit connects the first input node to the first capacitor, and the first capacitor samples and holds the first input voltage. In the second operation mode, the switch circuit connects the first input node to the second capacitor, and the second capacitor samples and holds the second input voltage. In the third operation mode, the switch circuit connects the output terminal of the amplifier circuit to one of the first and second capacitors, and the connects the second input node to the other of the first and second capacitors. In the fourth operation mode, the switch circuit connects the output terminal of the amplifier circuit to the other of the first and second capacitors, and connects the second input node to the one of the first and second capacitors.

Preferably, the switch circuit is formed of a first switch arranged between the first input node and a second node, a second switch arranged between the second input node and the second node, a third switch arranged between the second node and a third node connected to the first capacitor, a fourth switch arranged between the second node and a fourth node connected to the second capacitor, a fifth switch arranged between the output terminal of the amplifier circuit and the third node, and a sixth switch arranged between the output terminal of the amplifier circuit and the fourth node. In the first operation mode, the first and third switches are turned on. In the second operation mode, the first and fourth switches are turned on. In the third operation mode, the second, fourth and fifth switches are turned on. In the fourth operation mode, the second, third and sixth switches are turned on.

Preferably, the amplifier circuit is formed of a circuit of a differential type, and each of the plurality of arithmetic circuits includes an additional switch circuit arranged between the input and output terminals of the amplifier circuit. In the first and second operation modes, the additional switch circuit electrically connects the output terminal to the input terminal.

According to the A/D converter of the invention described above, since a function of averaging variations in capacitors is achieved by the arithmetic circuit in the next stage, the arithmetic circuit does not require a dedicated averaging circuit so that the A/D converter operating with high precision and small area penalty can be achieved.

Since the dedicated circuit is not required, it is possible to achieve the A/D converter operating precisely with power consumption at substantially the same level as a conventional A/D converter.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings. In the following description, the same or corresponding portions bear the same reference numbers, and description thereof is not repeated.

Figure 1:
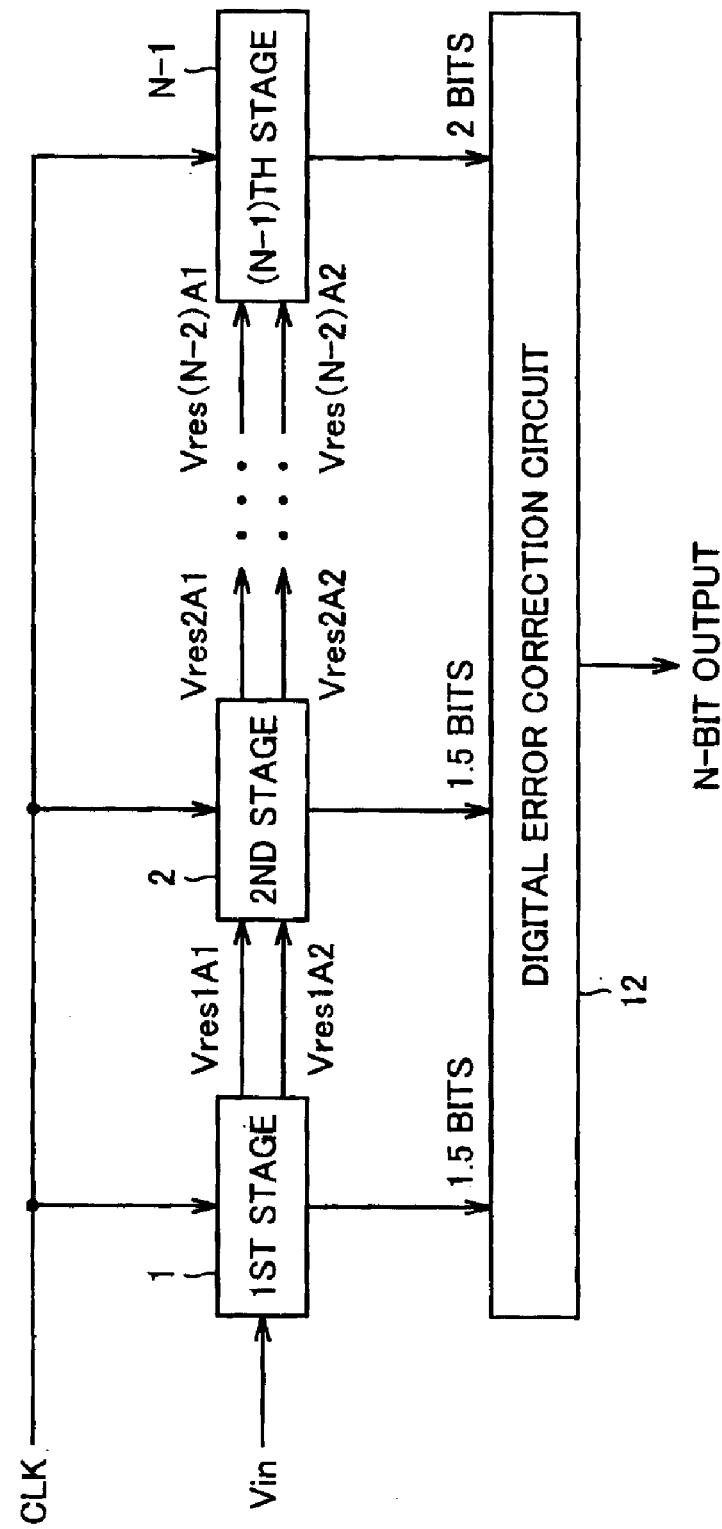
FIG. 1 is a block diagram schematically illustrating a whole structure of an A/D converter according to the invention.

FIG. 1 is a block diagram conceptually illustrating a whole structure of an A/D converter according to the invention.

Referring to FIG. 1, an A/D converter 10 is formed of stages of (N−1) in number connected in a pipeline fashion, and includes arithmetic circuits 1–N−1 corresponding to the first to (N−1)th stages, respectively, and a digital error correction circuit 12, which receives bit data provided from each stage, and performs error correction processing to output a final digital signal of N bits.

Similarly to conventional A/D converter 100 already described in connection with the background art, A/D converter 10 is configured such that the arithmetic circuit in each stage other than arithmetic circuit N−1 in the final stage provides data of 1.5 bits (ternary data) to digital error correction circuit 12, and arithmetic circuit N−1 in the final stage converts an analog signal received from an arithmetic circuit N−2 in the preceding stage to 2-bit data, and provides it to digital error correction circuit 12. Digital error correction circuit 12 is the same as that already described in connection with the background art.

In A/D converter 10 according to the invention, arithmetic circuits 1–N−1 perform the pipeline operation in synchronization with a clock signal CLK. Each of arithmetic circuits 1–N−1 repeats four continuous operation modes, i.e., "first sample mode", "second sample mode", "first hold mode" and "second hold mode" in synchronization with the rising and falling of clock signal CLK.

The first sample mode corresponds to a "first operation mode", and the second sample mode corresponds to a "second operation mode". The first hold mode corresponds to a "third operation mode", and the second hold mode corresponds to a "fourth operation mode".

Arithmetic circuit 1 forming the first stage converts an analog input signal Vin, which is received in the first sample mode, to data of 1.5 bits, and provides the converted bit data to digital error correction circuit 12. In the first sample mode, arithmetic circuit 1 samples analog input signal Vin by using predetermined capacitors. In the second sample mode, arithmetic circuit 1 samples analog input signal Vin by using capacitors different from those used in the first sample mode.

When arithmetic circuit 1 enters the first hold mode subsequently to the second sample mode, arithmetic circuit 1 calculates a residual voltage Vres1A1 based on analog input signals Vin sampled in the first and second sample modes, and provides residual voltage Vres1A1 thus obtained to arithmetic circuit 2 forming the second stage. In the second hold mode, arithmetic circuit 1 interchanges the capacitors as will be described later, and provides a residual voltage Vres1A2, which is calculated after such interchanging, to arithmetic circuit 2.

Arithmetic circuit 2 in the second stage converts residual voltage Vres1A1, which is received from the first stage during the first sample mode of arithmetic circuit 2, to data of 1.5 bits, and provides the converted bit data to digital error correction circuit 12. In the first sample mode, arithmetic circuit 2 samples residual voltage Vres1A1 by using predetermined capacitors. In the second sample mode, arithmetic circuit 2 samples residual voltage Vres1A2 received from the first stage by using capacitors different from those used in the first sample mode.

When arithmetic circuit 2 enters the first hold mode subsequently to the second sample mode, arithmetic circuit 2 calculates a residual voltage Vres2A1 based on residual voltages Vres1A1 and Vres1A2 sampled in the first and second sample modes, respectively, and provides residual voltage Vres2A1 thus obtained to the arithmetic circuit in the next stage. In the second hold mode, arithmetic circuit 2 provides a residual voltage Vres2A2, which is calculated after interchanging the capacitors, to the next stage.

Thereafter, the A/D conversion is performed similarly in each of the subsequent stages. When arithmetic circuit N−1 forming the last (N−1)th stage receives residual voltage Vres(N−2)A1 from the preceding stage, arithmetic circuit N−1 converts received residual voltage Vres(N−2)A1 to data of two bits, and provides the converted bit data to digital error correction circuit 12.

Based on the bit data provided from the respective stages, as described above, digital error correction circuit 12 performs addition of the respective bit data, and performs error correction so that a digital signal of N bits is finally output.

Figure 2:
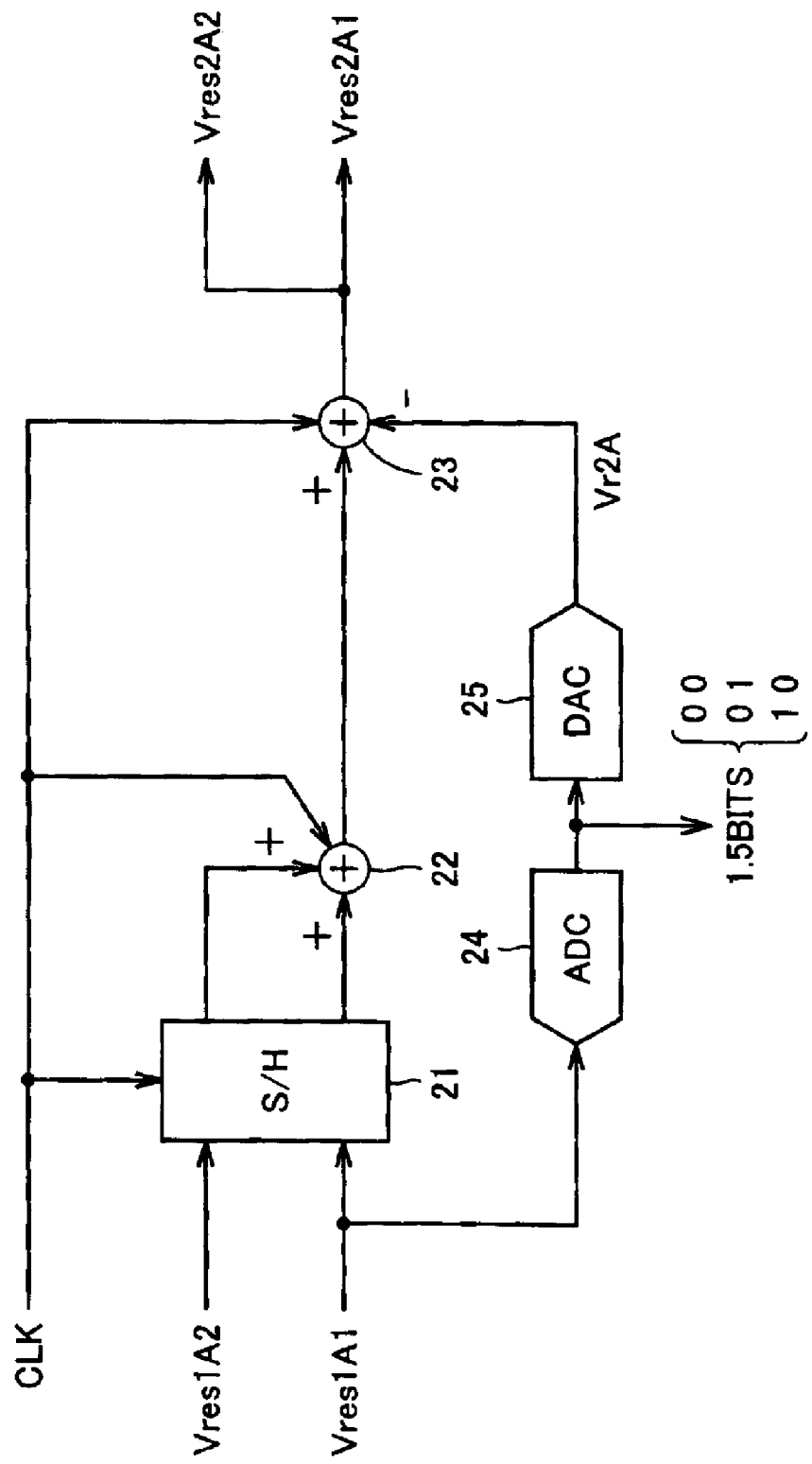
FIG. 2 is a function block diagram illustrating a structure and a function of an arithmetic circuit shown in FIG. 1.

FIG. 2 is a function block diagram illustrating a structure and a function of the arithmetic circuit shown in FIG. 1. Since all the arithmetic circuits have the same structure, FIG. 2 representatively illustrates a structure of arithmetic circuit 2. In arithmetic circuit N−1 in the last stage, output data of 2 bits is produced instead of output data of 1.5 bits illustrated in FIG. 2.

Referring to FIG. 2, arithmetic circuit 2 includes a sample hold portion 21, an adding portion 22, a subtracting portion 23, an A/D sub-converter 24 and a D/A sub-converter 25.

Sample hold portion 21 operates in synchronization with clock signal CLK. In the first and second sample modes, sample hold portion 21 samples and holds residual voltages Vres1A1 and Vres1A2 provided from arithmetic circuit 1 in the preceding stage, respectively. A/D sub-converter 24 and D/A sub-converter 25 are the same as those already described in connection with the background art.

Adding portion 22 operates in synchronization with clock signal CLK, and adds residual voltage Vres1A2, which is received from the preceding stage in the second sample mode, to residual voltage Vres1A1 held by sample hold portion 21.

In the first hold mode, subtracting portion 23 subtracts an analog voltage Vr2A converted by D/A sub-converter 25 from the voltage provided by adding portion 22, and provides the voltage thus produced to the next stage as residual voltage Vres2A1 in the second stage. In the second hold mode subsequent to the first hold mode, subtracting portion 23 interchanges the capacitors, as will be described later with reference to circuit diagrams, and subtracts analog voltage Vr2A converted by D/A sub-converter 25 from the voltage provided by adding portion 22 for providing the voltage thus produced to the next stage as residual voltage Vres2A2.

Figure 3:
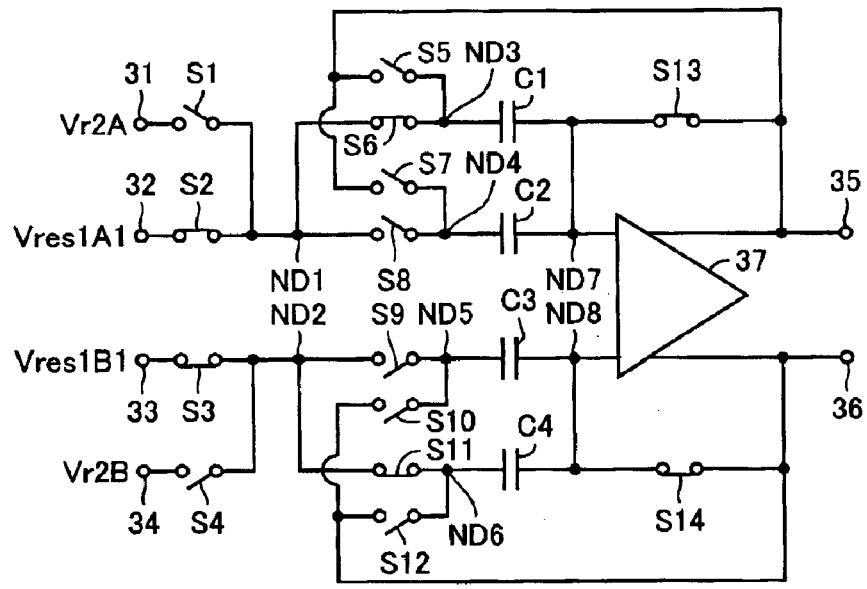
FIG. 3 is a circuit diagram showing a structure of a major portion of the arithmetic circuit shown in FIG. 2.

FIG. 3 is a circuit diagram showing a structure of a major portion of arithmetic circuit 2 shown in FIG. 2. FIG. 3 shows specific circuit structures of sample hold portion 21, adding portion 22 and subtracting portion 23 shown in FIG. 2. In practice, A/D converter 10 according to the invention has a circuit structure of a differential type, similarly to conventional A/D converter 100 already described.

Referring to FIG. 3, arithmetic circuit 2 includes switches S1–S14, capacitors C1–C4, a differential amplifier 37, nodes ND1–ND8, input nodes 31–34 and output nodes 35 and 36.

In the first sample mode, input nodes 32 and 33 receive residual voltages Vres1A1 and Vres1B1 provided from the preceding stage. In the second sample mode, input nodes 32 and 33 receive residual voltages Vres1A2 and Vres1B2 provided from the preceding stage, as will be described later. Input nodes 31 and 34 receive analog voltages Vr2A and Vr2B provided from D/A sub-converter 25, respectively.

Switch S1 is connected between input node 31 and node ND1, and switch S2 is connected between input node 32 and node ND1. Switch S3 is connected between input node 33 and node ND2, and switch S4 is connected between input node 34 and node ND2. Switch S5 is connected between output node 35 and node ND3, and switch S6 is connected between nodes ND1 and ND3. Switch S7 is connected between output node 35 and node ND4, and switch S8 is connected between nodes ND1 and ND4.

Switch S9 is connected between nodes ND2 and ND5, and switch S10 is connected between output node 36 and node ND5. Switch S1 is connected between nodes ND2 and ND6, and switch S12 is connected between output node 36 and node ND6. Switch S13 is connected between output node 35 and node ND7, and switch S14 is connected between output node 36 and node ND8.

Capacitor C1 is connected between nodes ND3 and ND7, and capacitor C2 is connected between nodes ND4 and ND7. Capacitor C3 is connected between nodes ND5 and ND8, and capacitor C4 is connected between nodes ND6 and ND8.

Differential amplifier 37 has input terminals connected to nodes ND7 and ND8, respectively, and has output terminals connected to output nodes 35 and 36, respectively. Differential amplifier 37 amplifies a voltage difference between nodes ND7 and ND8, and provides it to output nodes 35 and 36, FIG. 3 shows a state in the first sample mode. In the first sample mode, switches S2, S3, S6, S11, S13 and S14 are turned on in synchronization with clock signal CLK, and the other switches are turned off. In the first sample mode, therefore, capacitor C1 samples residual voltage Vres1A1 provided to input node 32, and capacitor C4 samples residual voltage Vres1B1 provided to input node 33.

In this circuit, switches S13 and S14 are turned on, and output terminals of differential amplifier 37 are connected to the input terminals. Thereby, each of capacitors C1 and C4 accumulates electric charges corresponding to a voltage difference between corresponding residual voltage Vres1A1 or Vres1B1 and an offset voltage Voff of differential amplifier 37. Offset voltage Voff is a voltage caused by a mismatch between transistors forming differential amplifier 37. In view of this offset voltage Voff, charges Q1 and Q4 accumulated on the side of differential amplifier 37 in capacitors C1 and C4 can be expressed in the following formulas, in which capacitances are represented by the same reference characters as the corresponding capacitors, respectively.

$$Q1=C1(Voff-Vres1A1) \tag{11}$$

$$Q4=C4(Voff-Vres1B1) \tag{12}$$

Figure 4:
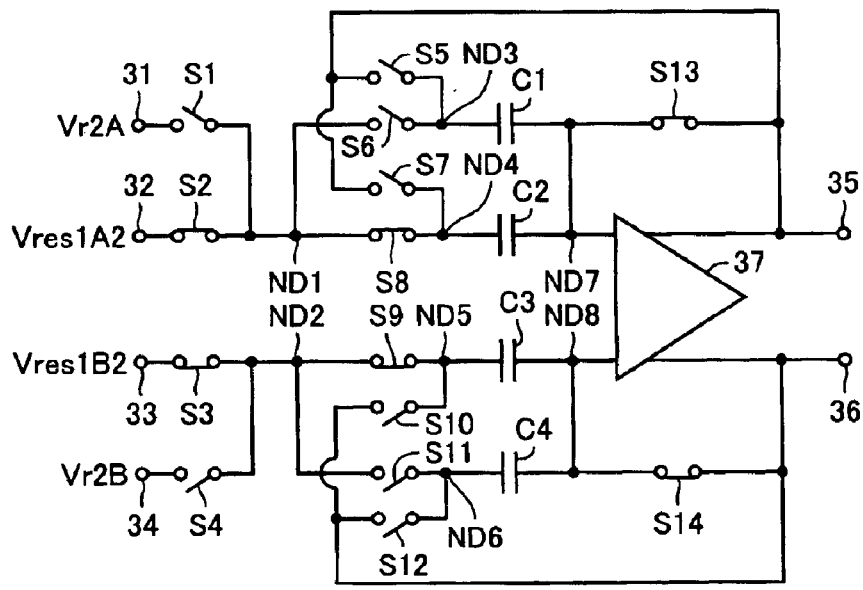
FIG. 4 shows a state in a second sample mode of the arithmetic circuit shown in FIG. 2.

FIG. 4 shows a state in the second sample mode of arithmetic circuit 2 shown in FIG. 2.

In the second sample mode, as shown in FIG. 4, switches S2, S3, S8, S9, S13 and S14 are turned on in synchronization with clock signal CLK, and the other switches are turned off. In the second sample mode, therefore, capacitor C2 samples residual voltage Vres1A2 provided to input node 32, and capacitor C3 samples residual voltage Vres1B2 provided to input node 33. More specifically, charges Q2 and Q3 accumulated on the side of differential amplifier 37 in capacitors C2 and C3 can be expressed in the following formulas, in which capacitances are represented by the same reference characters as the corresponding capacitors, respectively:

$$Q2=C2(Voff-Vres1A2) \tag{13}$$

$$Q3=C3(Voff-Vres1B2) \tag{14}$$

Since capacitors C1 and C2 are connected together via node ND7, charges of capacitors C1 and C2 are added together, and residual voltages Vres1A1 and Vres1A2 sampled by capacitors C1 and C2 are added together. Since capacitors C3 and C4 are connected together via node ND8, residual voltages Vres1B1 and Vres1B2 sampled by capacitors C3 and C4 are added together.

Figure 5:
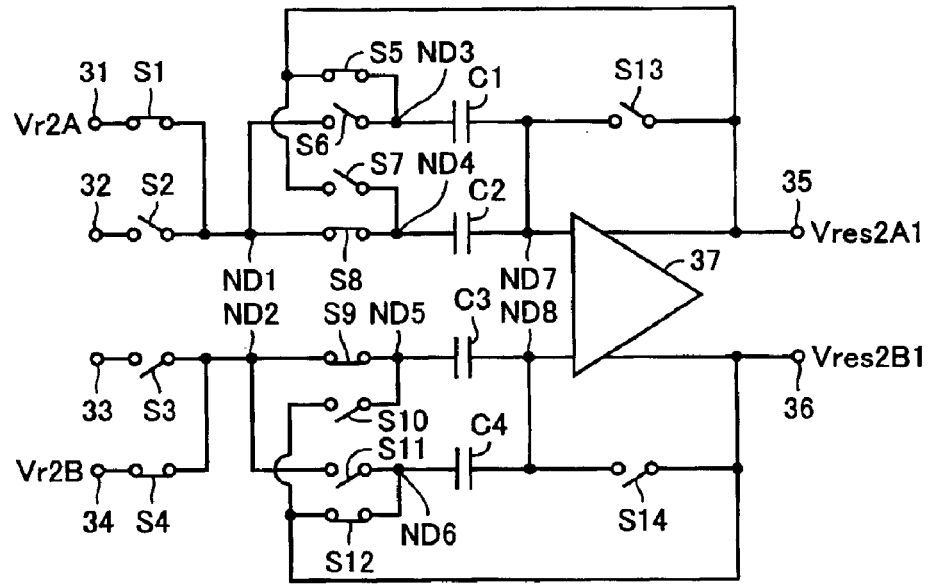
FIG. 5 shows a state in a first hold mode of the arithmetic circuit shown in FIG. 2.

FIG. 5 shows a state in the first hold mode of arithmetic circuit 2 shown in FIG. 2.

In the first hold mode, as shown in FIG. 5, switches S1, S4, S5, S8, S9 and S12 are turned on in synchronization with clock signal CLK, and the other switches are turned off. Thereby, capacitors C1 and C4 operate as feedback capacitors, and capacitors C2 and C3 operate as capacitors sampling analog voltages Vr2A and Vr2B.

Output node 35 is supplied with a voltage produced by subtracting analog voltage Vr2A sampled by capacitor C2 from the voltage produced by the addition using capacitors C1 and C2, and output node 36 is supplied with the voltage produced by subtracting analog voltage Vr2B sampled by capacitor C3 from the voltage produced by the addition using capacitors C3 and C4. More specifically, residual voltages Vres2A1 and Vres2B1 provided to output nodes 35 and 36 in the first hold mode are expressed by the following formulas:

$$Vres2A1=Vres1A1+(C2/C1)Vres1A2-(C2/C1)Vr2A \tag{15}$$

$$Vres2B1=Vres1B1+(C3/C4)Vres1B2-(C3/C4)Vr2B \tag{16}$$

In the above formulas, it can be understood that offset voltage Voff is cancelled, and offset voltage compensation for differential amplifier 37 is performed.

Figure 6:
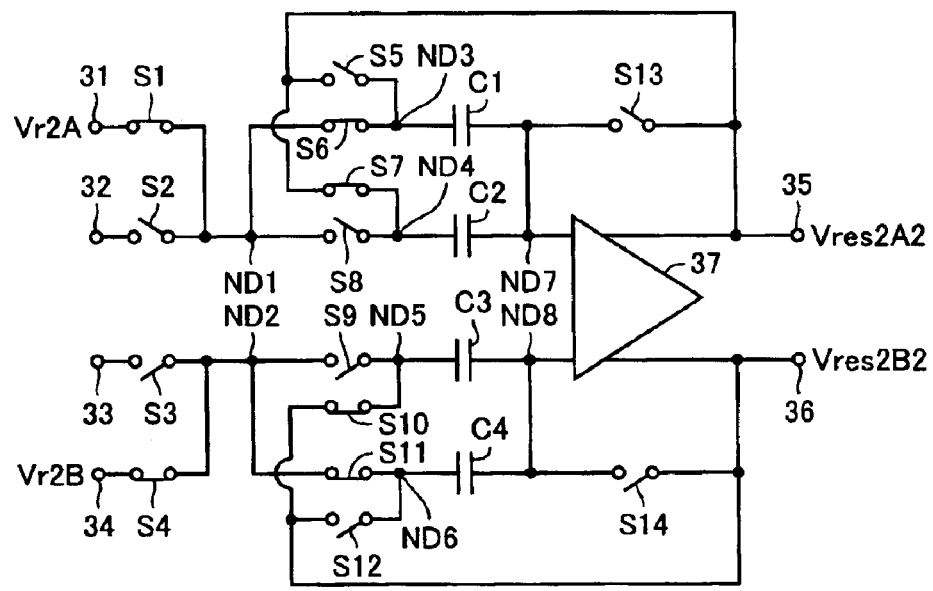
FIG. 6 shows a state in a second hold mode of the arithmetic circuit shown in FIG. 2.

FIG. 6 shows a state in the second hold mode of arithmetic circuit 2 shown in FIG. 2.

In the second hold mode, as shown in FIG. 6, switches S1, S4, S6, S7, S10 and S11 are turned on in synchronization with clock signal CLK, and the other switches are turned off. Thereby, capacitors C2 and C3 operate as feedback capacitors, and capacitors C1 and C4 operate as capacitors sampling analog voltages Vr2A and Vr2B, respectively.

Output node 35 is supplied with a voltage produced by subtracting analog voltage Vr2A sampled by capacitor C1 from the voltage produced by the addition using capacitors C1 and C2, and output node 36 is supplied with a voltage produced by subtracting analog voltage Vr2B sampled by capacitor C4 from the voltage produced by the addition using capacitors C3 and C4. More specifically, residual voltages Vres2A2 and Vres2B2 provided to output nodes 35 and 36 in the second hold mode are expressed by the following formulas:

$$Vres2A2=Vres1A1+(C1/C2)Vres1A2-(C1/C2)Vr2A \quad (17)$$

$$Vres2B2=Vres1B1+(C4/C3)Vres1B2-(C4/C3)Vr2B \quad (18)$$

According to A/D converter 10 described above, variations in capacitors of the arithmetic circuit are cancelled when the residual voltages, which are provided in the first and second hold modes, respectively, are added together by the adding portion of the arithmetic circuit in the next stage. This will now be described.

Figure 7:
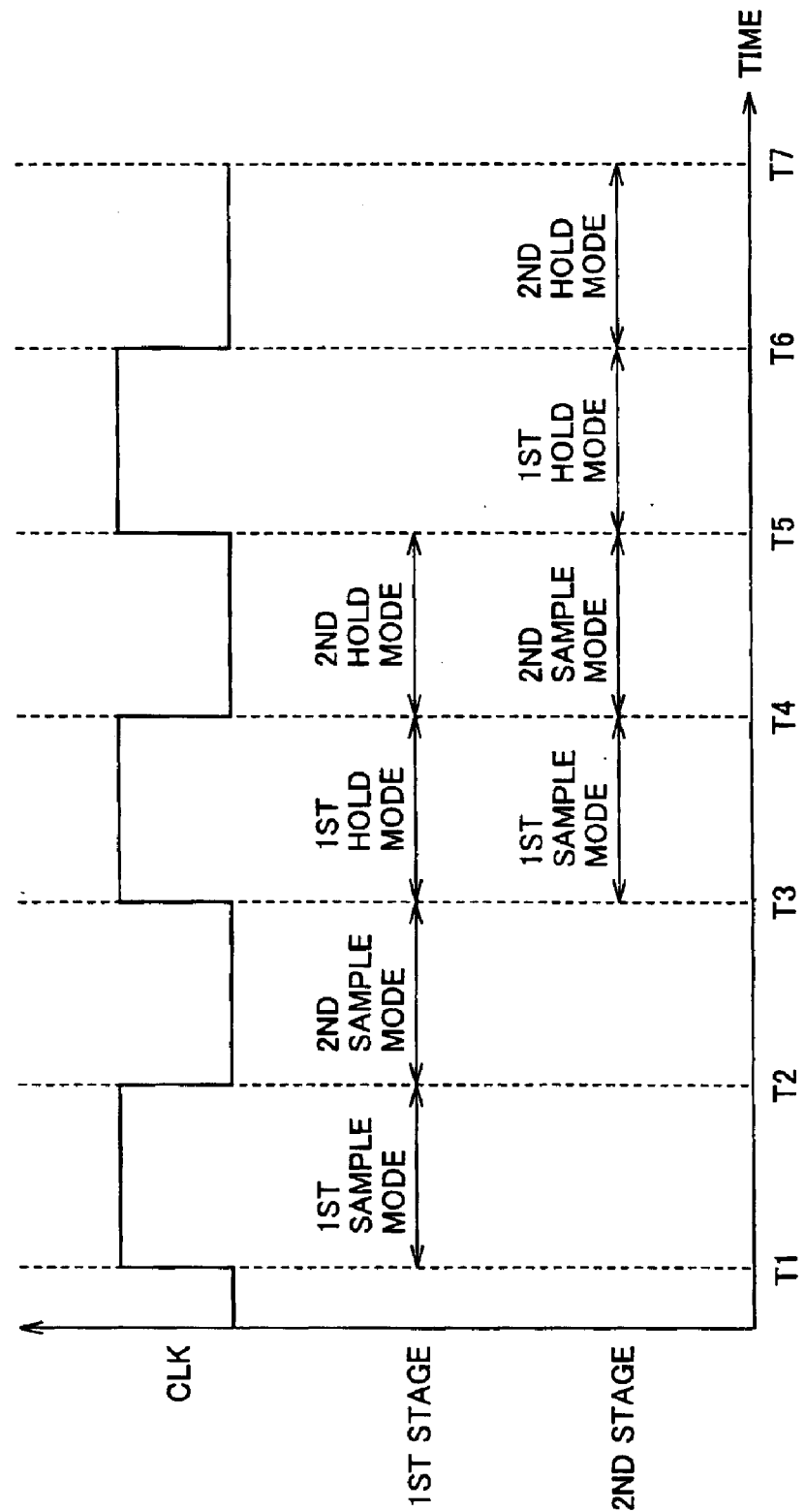
FIG. 7 shows a relationship in operation mode between neighboring stages.

FIG. 7 illustrates a relationship in operation mode between the neighboring stages.

Referring to FIG. 7, when clock signal CLK rises at a time T1, the first stage (arithmetic circuit 1) enters the first sample mode, and thereafter the operation mode thereof will successively change to the second sample mode, the first hold mode and the second hold mode in synchronization with the falling and rising of clock signal CLK.

The second stage (arithmetic circuit 2) enters the first sample mode with a delay of one cycle of from the first stage. Thus, the second stage enters the first sample mode when the first stage enters the first hold mode at a time T3. Therefore, arithmetic circuit 2 forming the second stage samples residual voltages Vres1A1 and Vres1B1, which are provided from arithmetic circuit 1 forming the first stage in response to the first hold mode.

At a time T4, the second stage enters the second sample mode, and samples residual voltages Vres1A2 and Vres1B2, which are provided from arithmetic circuit 1 in response to the second hold mode. At subsequent times T5 and T6, the second stage changes its operation mode to the first and second hold modes, respectively.

FIGS. 8 to 13 show the states of the first and/or second stages at various times illustrated in FIG. 7. Circuit diagrams of FIGS. 8 to 13 do not accurately show the circuits, and some portions of structures are shown in a simplified manner for the sake of illustration. In these figures, a number representing the stage is added as a suffix to the reference number for discriminating each stage from the others.

Figure 8:
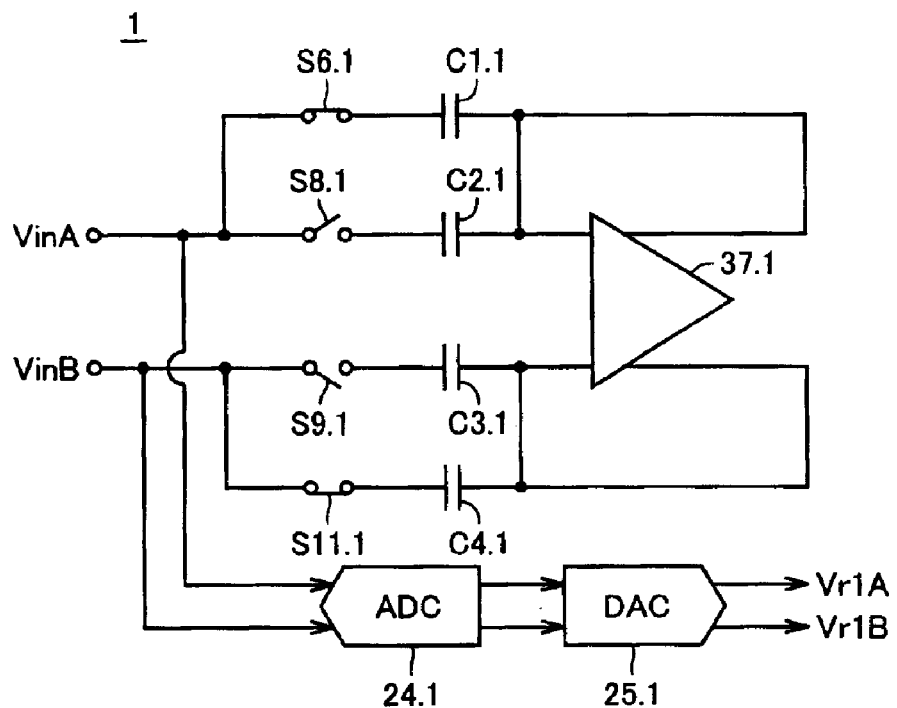
FIG. 8 shows a state of the first stage in a first sample mode.

FIG. 8 shows a state of the first stage in the first sample mode.

In arithmetic circuit 1, which forms the first stage and is shown in FIG. 8, switches S6.1 and S11.1 are turned on in synchronization with clock signal CLK, and switches S8.1 and S9.1 are turned off. Thereby, capacitors C1.1 and C4.1 sample analog input signals VinA and VinB, respectively. A/D sub-converter 24.1 converts analog input signals VinA and VinB to the digital signals of 1.5 bits, and D/A sub-converter 25.1 converts the digital signals thus converted to analog voltages Vr1A and Vr1B.

Figure 9:
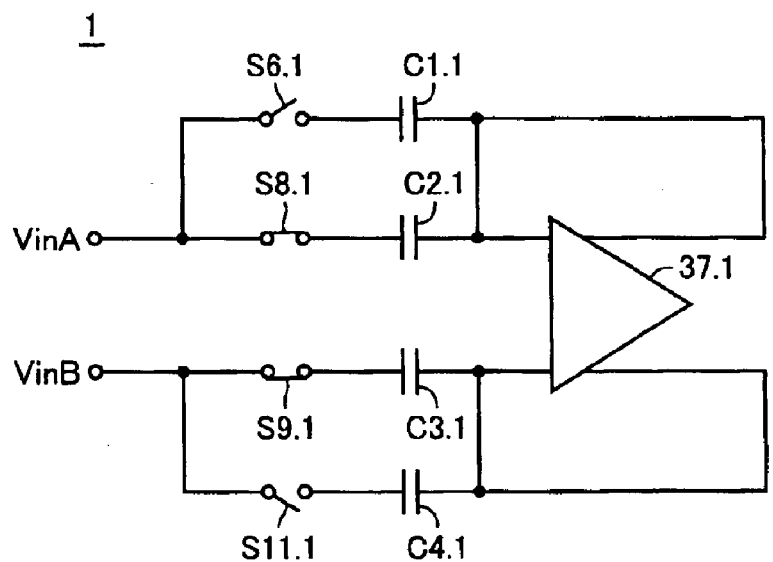
FIG. 9 shows a state of the first stage in a second sample mode.

FIG. 9 shows a state of the first stage in the second sample mode.

In arithmetic circuit 1 shown in FIG. 9, switches S8.1 and S9.1 are turned on in synchronization with clock signal CLK, and switches S6.1 and S11.1 are turned off. Thereby, capacitors C2.1 and C3.1 sample analog input signals VinA and VinB, respectively.

Figure 10:
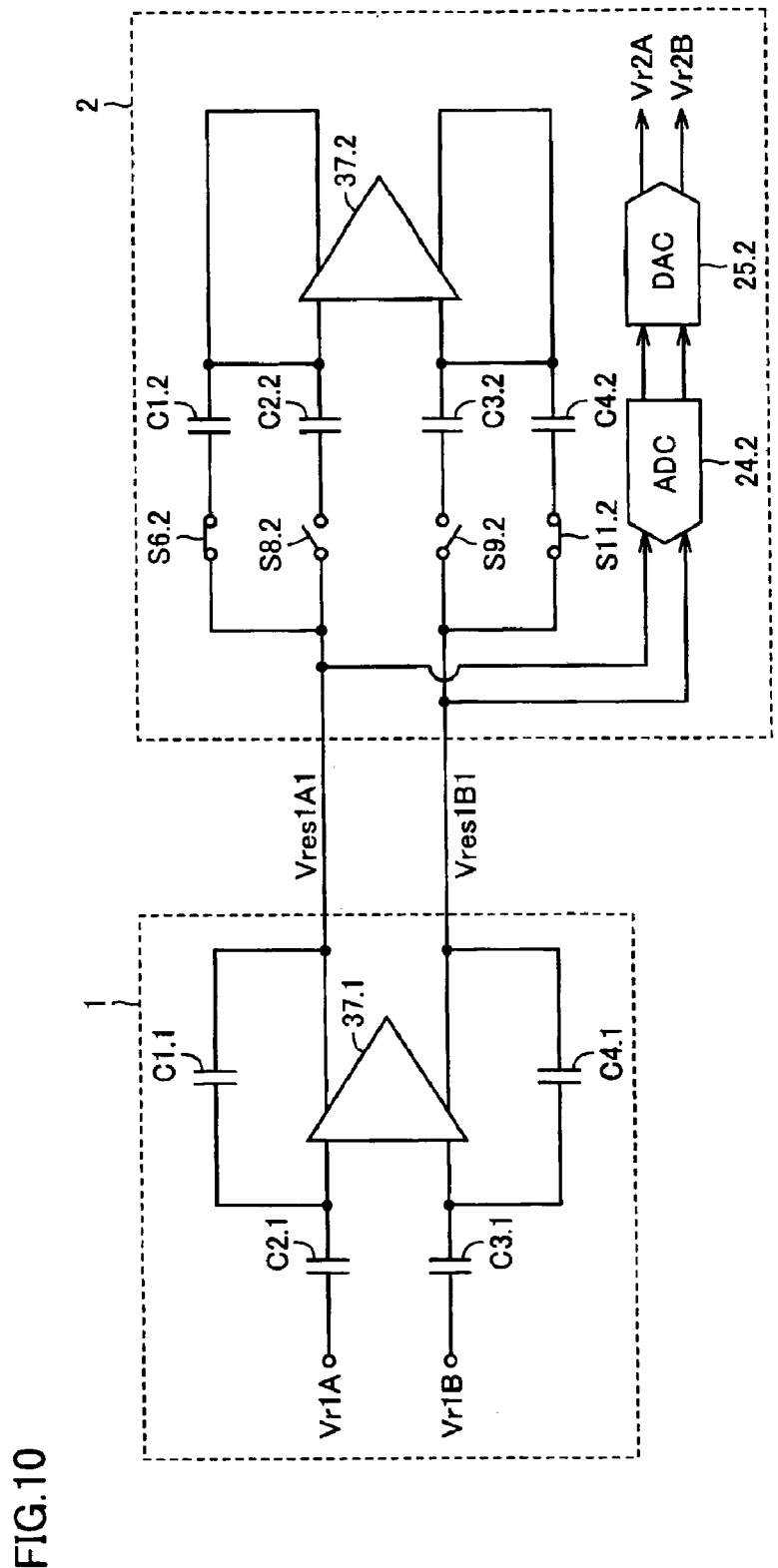
FIG. 10 shows a state of the first and second stages in the first hold mode and the first sample mode, respectively.

FIG. 10 shows a state, in which the first and second stages are in the first hold mode and the first sample mode, respectively.

In arithmetic circuit 1 shown in FIG. 10, capacitors C1.1 and C4.1 operate as feedback capacitors, and capacitors C2.1 and C3.1 sample analog voltages Vr1A and Vr1B, respectively. Arithmetic circuit 1 provides residual voltages Vres1A1 and Vres1B1.

Assuming that capacitors C1.1–C4.1 in arithmetic circuit 1 have capacitances satisfying relationships of (C1.1= C4.1=C and C2.1=C3.1=C(1+α), where α represents variations in capacitors of arithmetic circuit 1, residual voltages Vres1A1 and Vres1B1 can be expressed as follows by using the foregoing formulas (15) and (16):

$$Vres1A1=VinA+(C(1+\alpha)/C)VinA-(C(1+\alpha)/C)Vr1A \quad (19)$$

$$Vres1B1=VinB+(C(1+\alpha)/C)VinB-(C(1+\alpha)/C)Vr1B \quad (20)$$

In arithmetic circuit 2 forming the second stage, switches S6.2 and S11.2 are turned on in synchronization with clock signal CLK, and switches S8.2 and S9.2 are turned off. Thereby, capacitors C1.2 and C4.2 sample residual voltages Vres1A1 and Vres1B1 provided from arithmetic circuit 1. A/D sub-converter 24.2 converts residual voltages Vres1A1 and Vres1B1 to the digital signals of 1.5 bits, and D/A sub-converter 25.2 converts the digital signals thus converted to analog voltages Vr2A and Vr2B.

Figure 11:
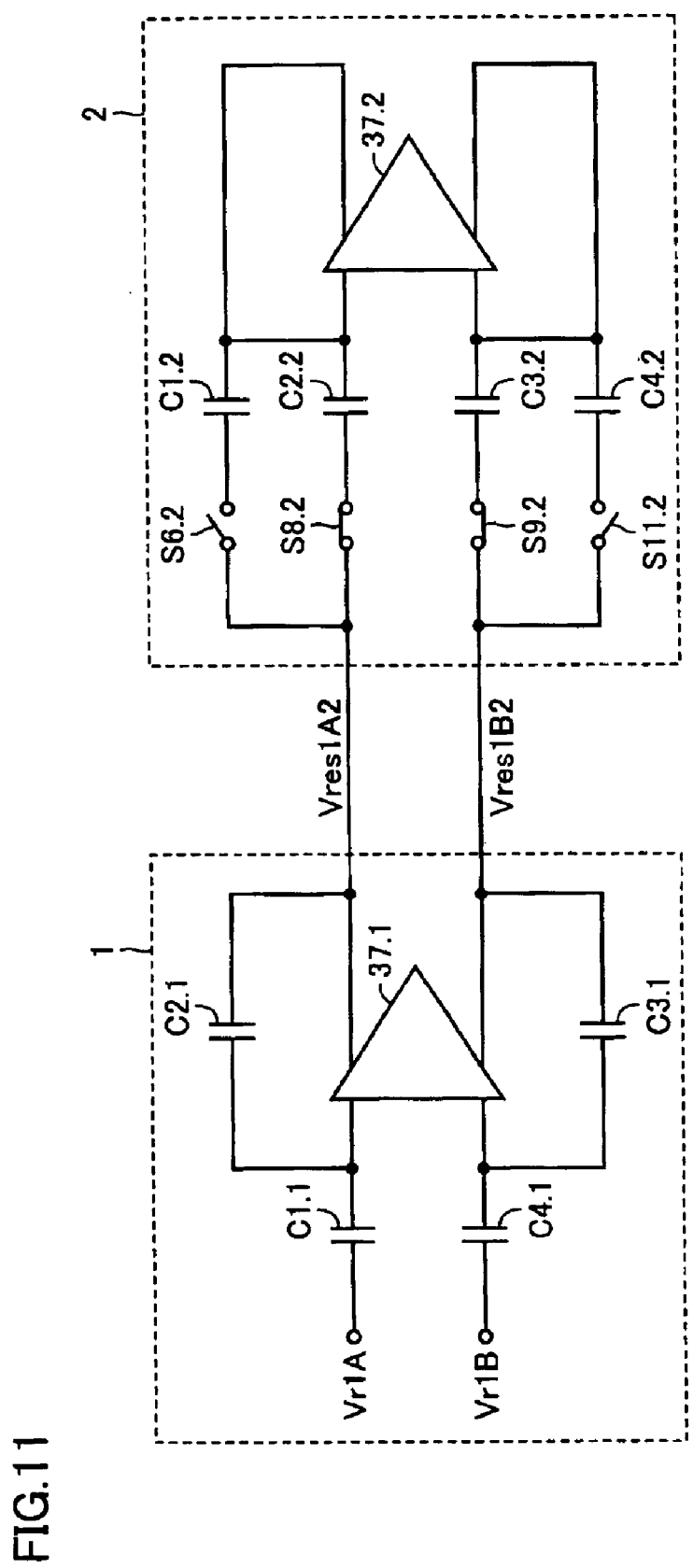
FIG. 11 shows a state of the first and second stages in the second hold mode and the second sample mode, respectively.

FIG. 11 shows a state, in which the first and second stages are in the second hold mode and the second sample mode, respectively.

In arithmetic circuit 1 shown in FIG. 11, capacitors C2.1 and C3.1 operate as feedback capacitors, and capacitors C1.1 and C4.1 sample analog voltages Vr1A and Vr1B. Arithmetic circuit 1 provides residual voltages Vres1A2 and Vres1B2. Residual voltages Vres1A2 and Vres1B2 can be expressed as follows by using the foregoing formulas (17) and (18):

$$Vres1A2=VinA+(C/C(1+\alpha))VinA-(C/C(1+\alpha))Vr1A \quad (21)$$

$$Vres1B2=VinB+(C/C(1+\alpha))VinB-(C/C(1+\alpha))Vr1B \quad (22)$$

In arithmetic circuit 2, switches S8.2 and S9.2 are turned on in synchronization with clock signal CLK, and switches S6.2 and S11.2 are turned off so that capacitors C2.2 and C3.2 sample residual voltages Vres1A2 and Vres1B2 provided from arithmetic circuit 1.

Figure 12:
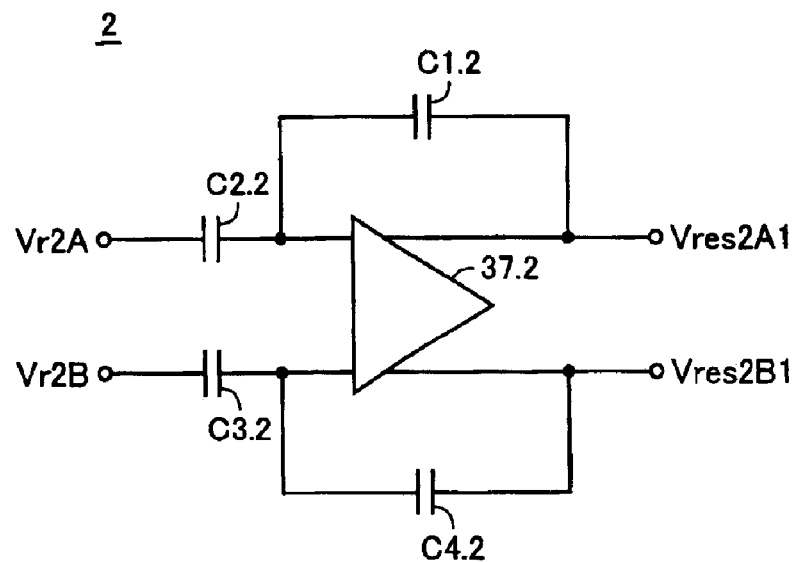
FIG. 12 shows a state of the second stage in the first hold mode.

FIG. 12 shows a state of the second stage in the first hold mode.

In arithmetic circuit 2 shown in FIG. 12, capacitors C1.2 and C4.2 operate as feedback capacitors, and capacitors C2.2 and C3.2 sample analog voltages Vr2A and Vr2B, respectively. Arithmetic circuit 2 outputs residual voltages Vres2A1 and Vres2B1.

It is assumed in arithmetic circuit 2 that capacitors C1.2–C4.2 have capacitances satisfying relationships of (C1.2=C4.2=C and C2.2=C3.2=C(1+β)), where β represents variations in capacitors of arithmetic circuit 2. Further, the formulas (19) and (21) are substituted into the formula (15), and the formulas (20) and (22) are substituted into the formula (16). By arranging the formulas thus prepared, residual voltages Vres2A1 and Vres2B1 are expressed by the following formulas, respectively:

$$Vres2A1=2(2VinA-Vr1A)-Vr2A+\beta(2VinA-Vr1A-Vr2A) \quad (23)$$

$$Vres2B1=2(2VinB-Vr1B)-Vr2B+\beta(2VinB-Vr1B-Vr2B) \quad (24)$$

Figure 13:
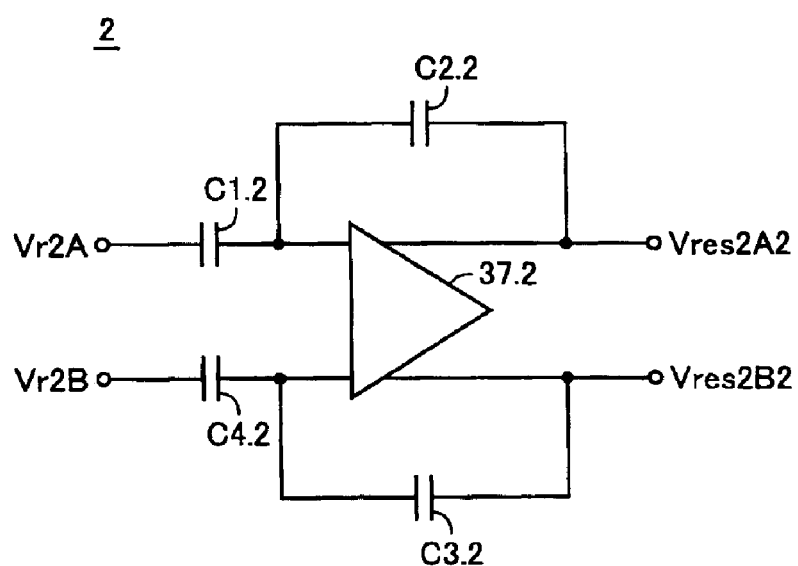
FIG. 13 shows a state of the second stage in the second hold mode.
Figure 14:
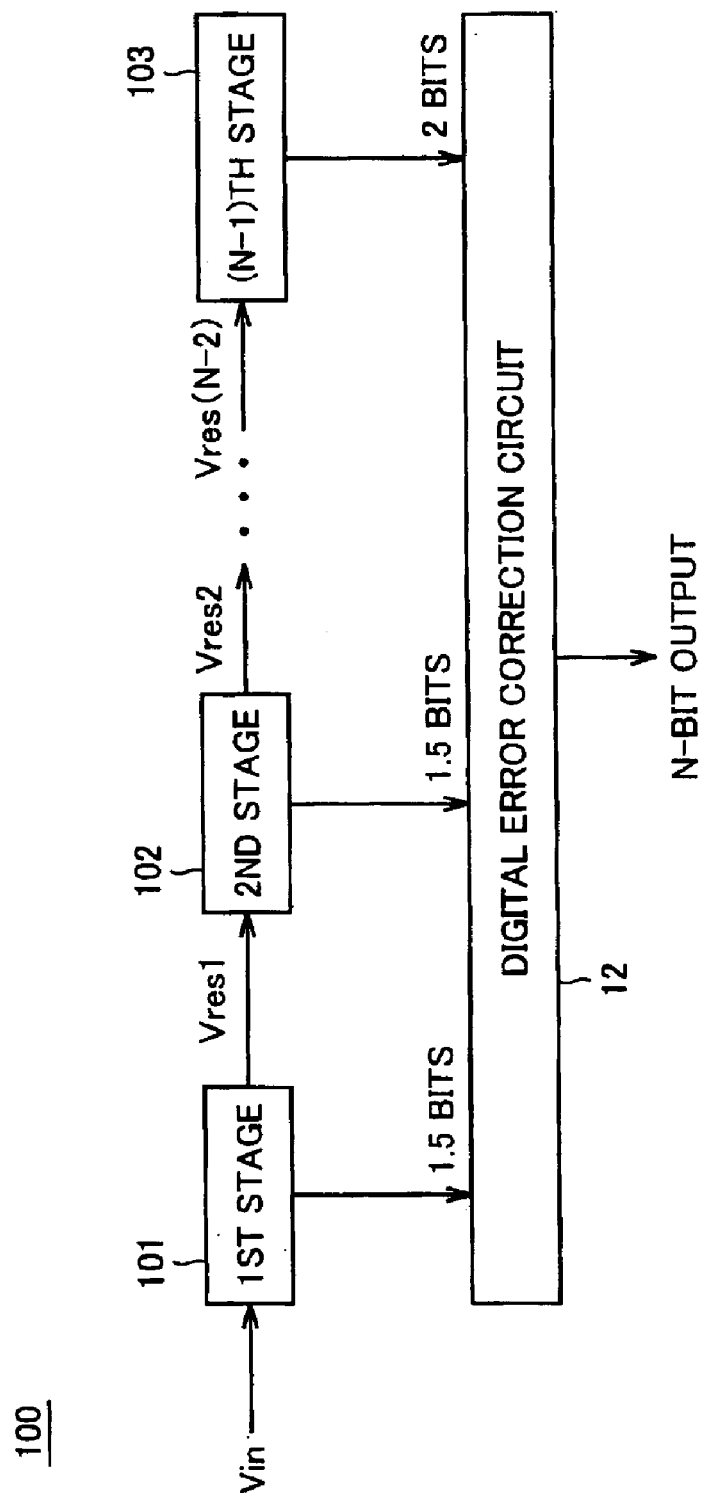
FIG. 14 is a block diagram schematically illustrating a whole structure of a conventional pipelined A/D converter.
Figure 15:
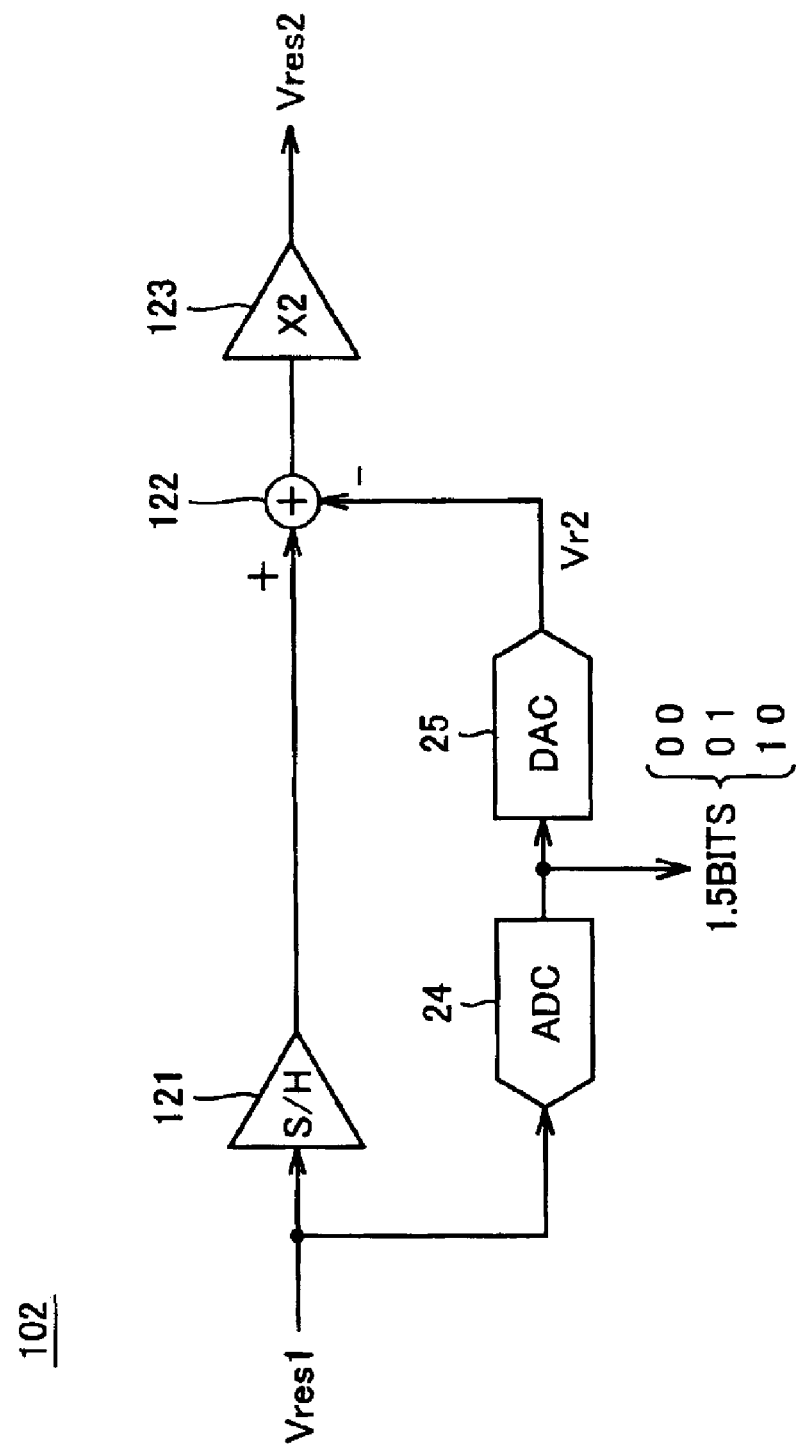
FIG. 15 is a function block diagram illustrating a structure and a function of an arithmetic circuit shown in FIG. 14.
Figure 16:
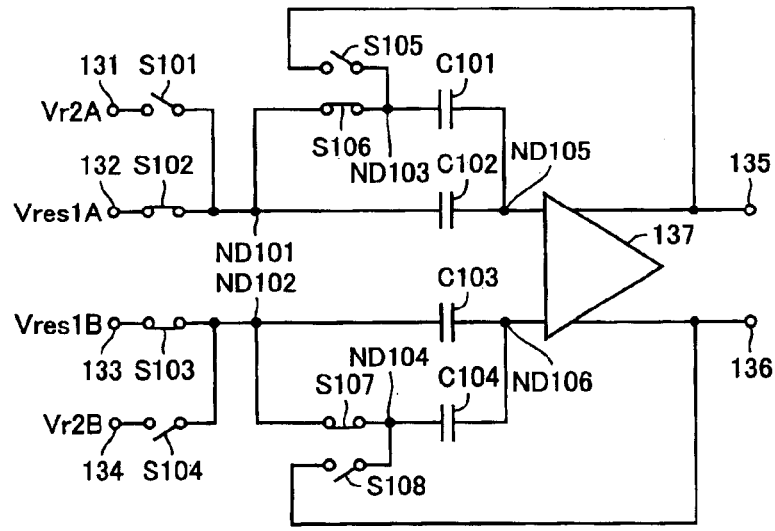
FIG. 16 is a circuit diagram showing a structure of a major portion of the arithmetic circuit shown in FIG. 15.
Figure 17:
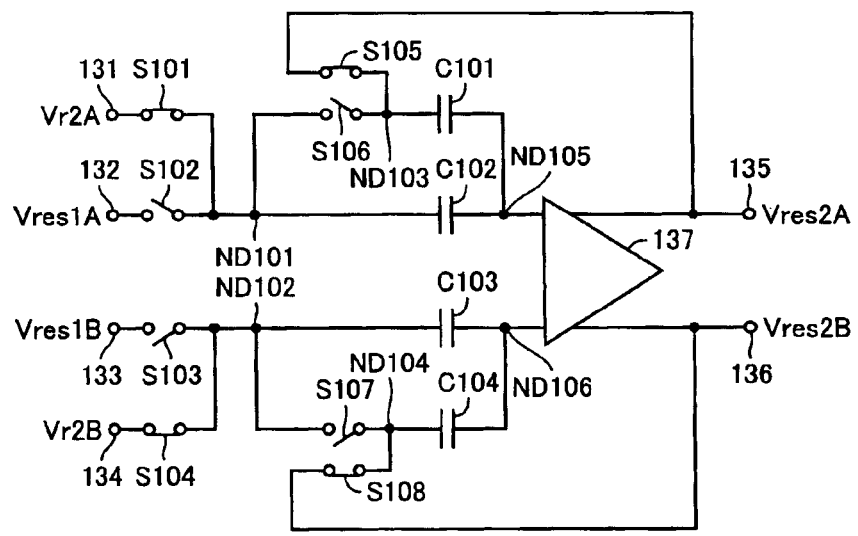
FIG. 17 shows a state in a hold mode of the arithmetic circuit shown in FIG. 15.
Figure 18:
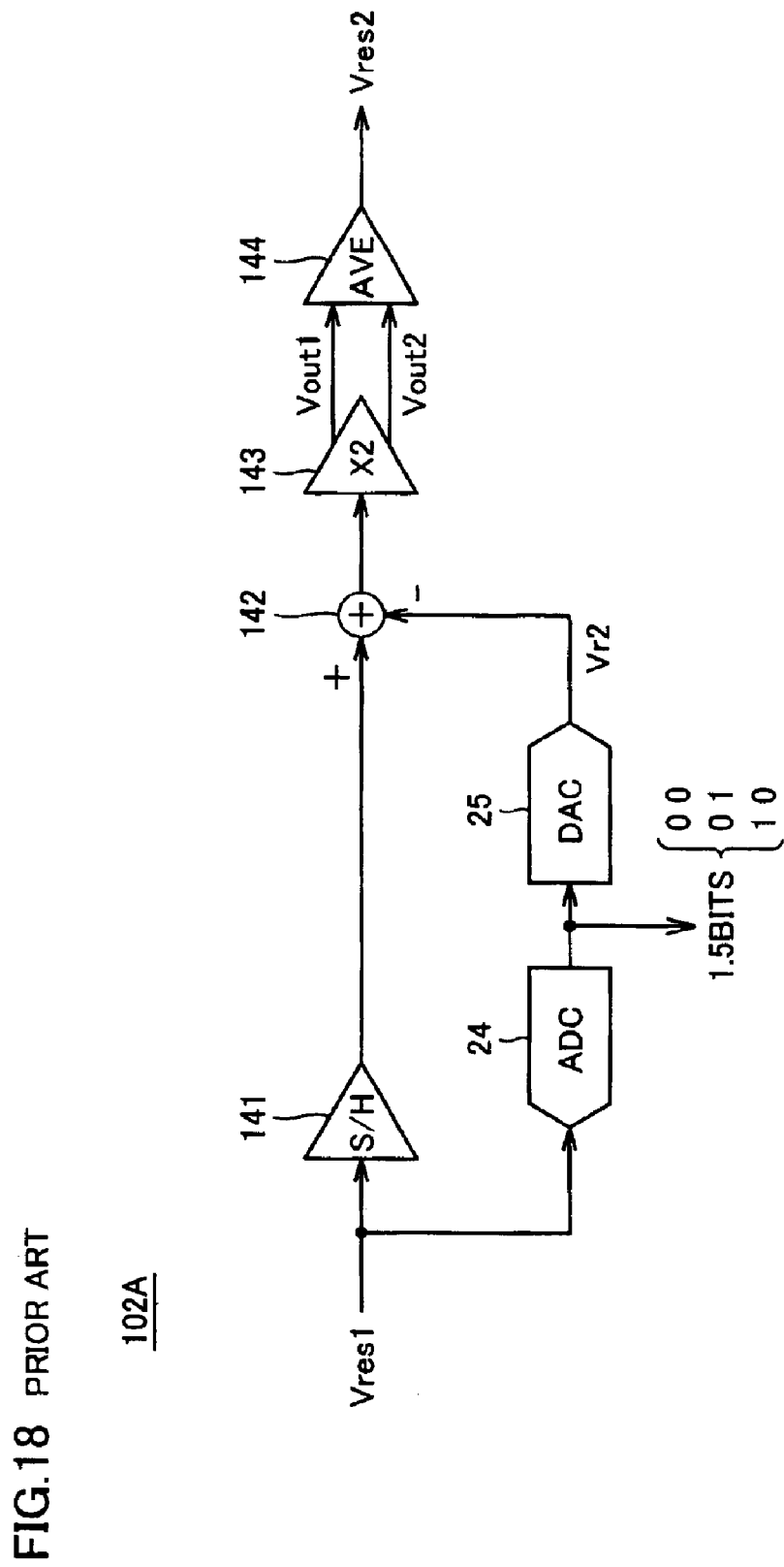
FIG. 18 is a function block diagram illustrating a structure and a function of the arithmetic circuit in the averaging A/D converter.
Figure 19:
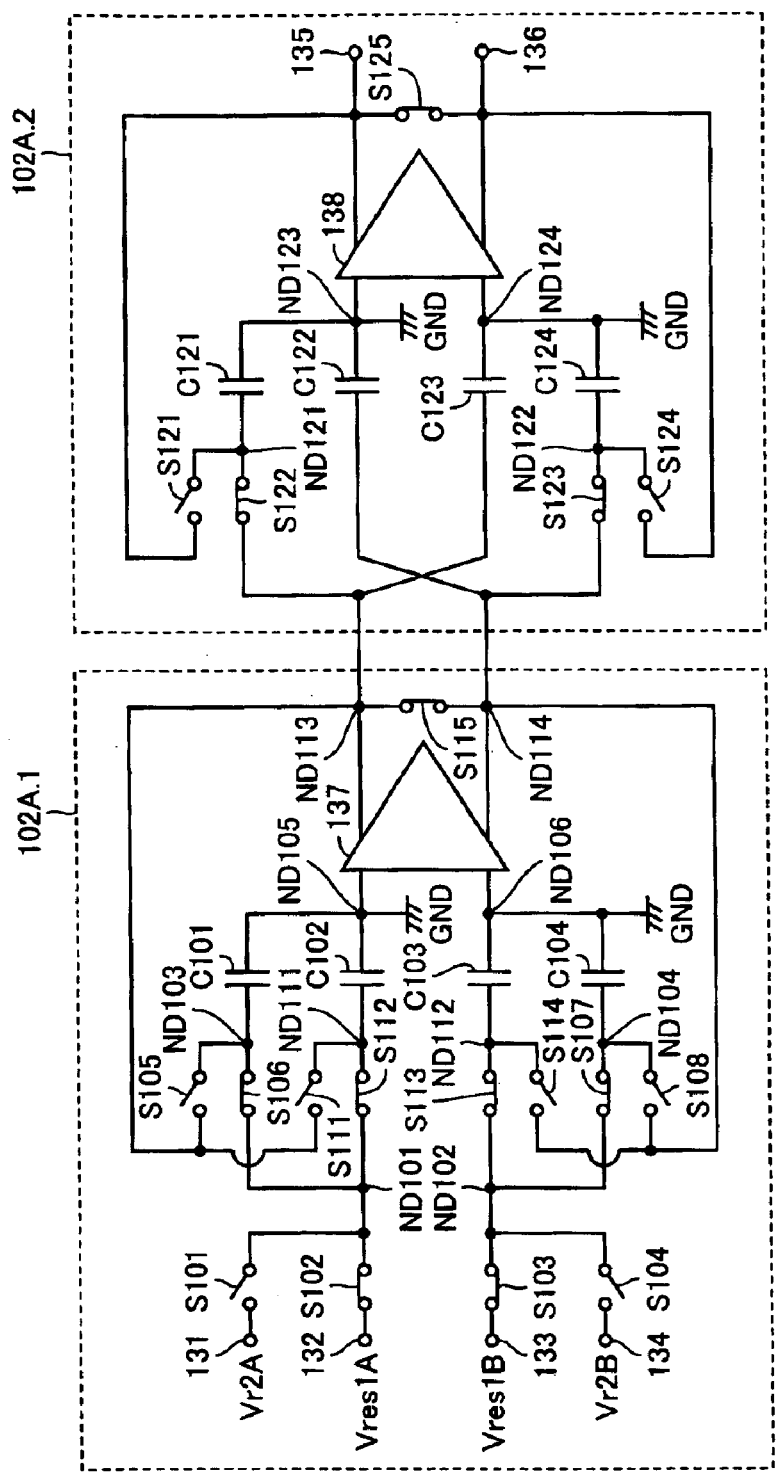
FIG. 19 is a circuit diagram showing a structure of a major portion of the arithmetic circuit shown in FIG. 18.
Figure 20:
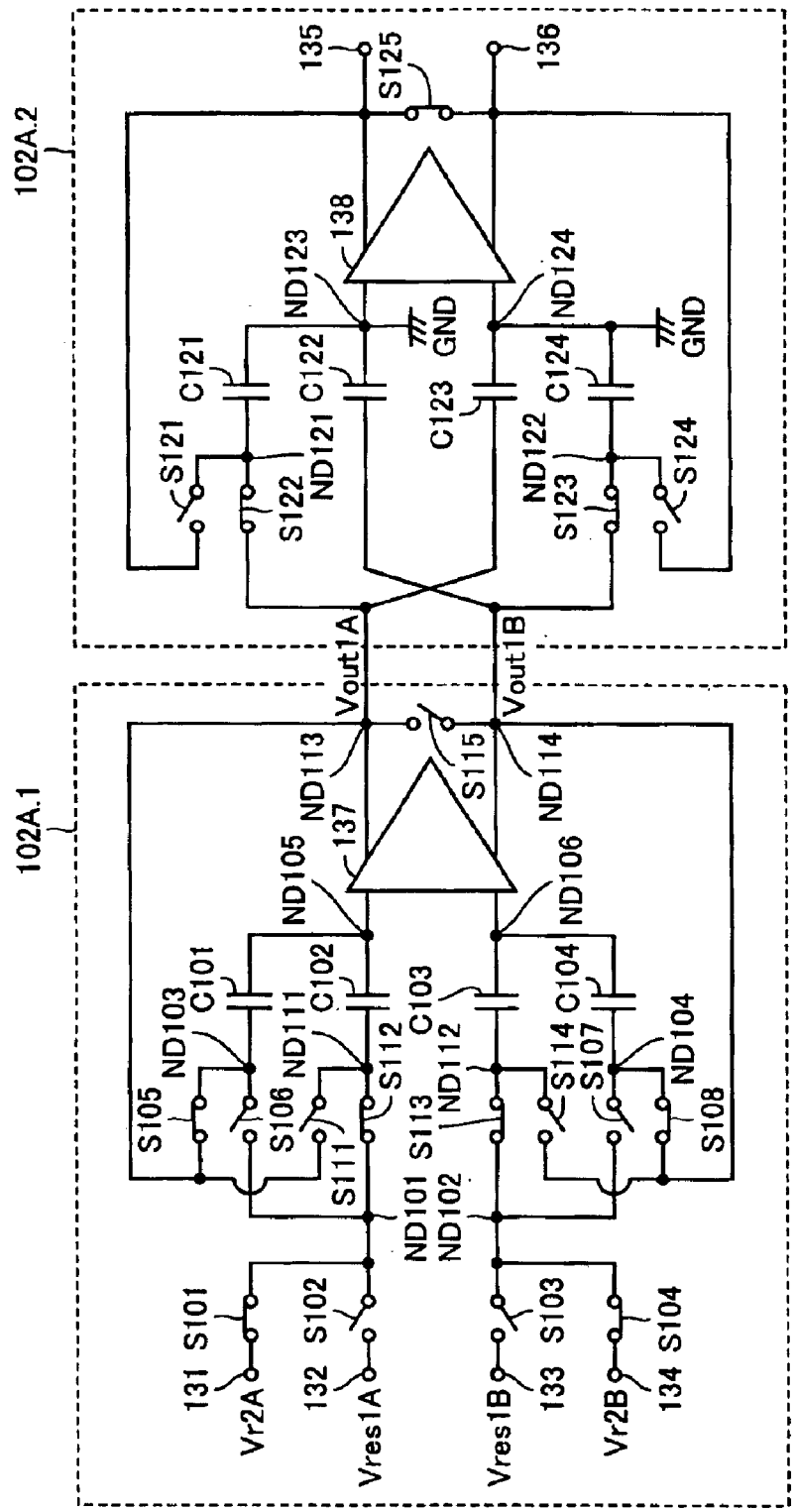
FIG. 20 shows a state in the hold mode of the arithmetic circuit shown in FIG. 18.
Figure 21:
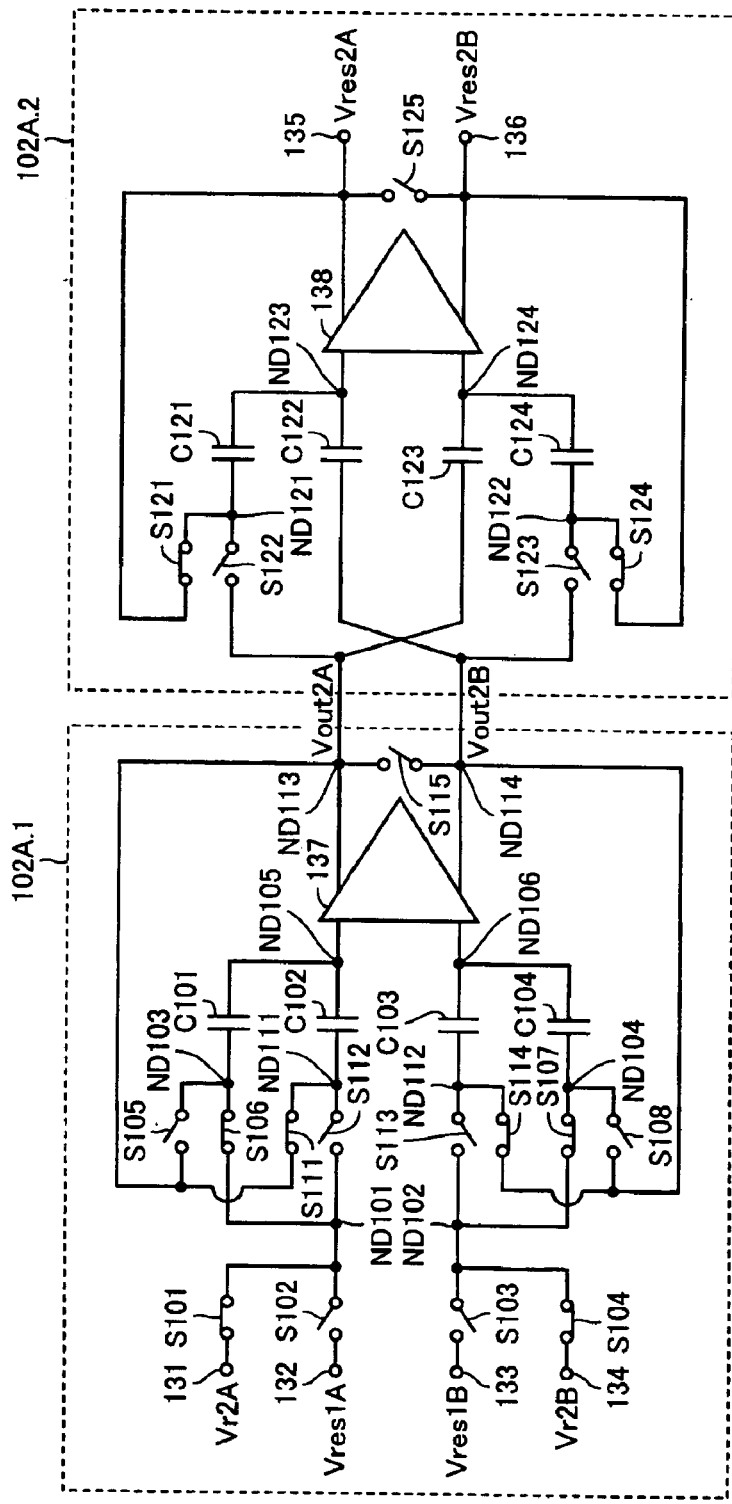
FIG. 21 shows a state in an averaging mode of the arithmetic circuit shown in FIG. 18.

FIG. 13 shows a state of the second stage in the second hold mode.

In arithmetic circuit 2 shown in FIG. 13, capacitors C2.2 and C3.2 operate as feedback capacitors, and capacitors C1.2 and C4.2 sample analog voltages Vr2A and Vr2B, respectively. Arithmetic circuit 2 provides residual voltages Vres2A2 and Vres2B2. The formulas (19) and (21) are substituted into the formula (17), and the formulas (20) and (22) are substituted into the formula (18). By arranging the formulas thus prepared, residual voltages Vres2A2 and Vres2B2 are expressed by the following formulas:

$$Vres2A2 = 2(2VinA - Vr1A) - Vr2A - \beta(2VinA - Vr1A - Vr2A) \quad (25)$$

$$Vres2B2 = 2(2VinB - Vr1B) - Vr2B - \beta(2VinB - Vr1B - Vr2B) \quad (26)$$

From the above formulas (23)–(26), it can be understood that $\alpha$ is cancelled, and variations $\alpha$ in capacitors in the first stage are cancelled in the next stage, i.e., second stage. By repeating this in neighboring stages, variations in capacitors in all the stages are cancelled.

Although A/D converter 10, which has been described, has the circuit structure of the differential type, the circuit structure of the differential type is not essential. The circuit structure of the differential type is employed because it can have a large input range.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An analog-to-digital converter of a pipeline type for converting an analog signal to a digital signal, comprising:
    a plurality of arithmetic circuits arranged in accordance with a bit length of said digital signal, and connected in series; and
    an output circuit providing said digital signal based on bit data provided from each of said plurality of arithmetic circuits, wherein
    each of said plurality of arithmetic circuits includes:
    an analog-to-digital sub-converter converting an input voltage received in a sample mode to said bit data, and providing said bit data,
    a digital-to-analog sub-converter converting said bit data to an analog voltage,
    sample hold portion sampling first and second input voltages received in first and second operation modes in said sample mode, respectively, and holding the sampled first and second input voltages in first and second voltage holding portions, respectively,
    adding portion adding the voltages held in said sample hold portion, and
    subtracting portion subtracting the analog voltage of said bit data from a voltage produced by the addition by said adding portion, and providing a voltage produced by the subtraction to the arithmetic circuit in the next stage, and
    said subtracting portion operates, in a third operation mode, to subtract said analog voltage from said voltage produced by the addition, and to output a voltage produced by the subtraction as said first input voltage for the next stage, and operates, in a fourth operation mode, to subtract said analog voltage from said voltage produced by the addition, with said first and second voltage holding portions interchanged with each other, and to output a voltage produced by the subtraction as said second input voltage for the next stage.

2. The analog-to-digital converter according to claim 1, wherein
    each of said plurality of arithmetic circuits successively changes to said first to fourth operation modes in synchronization with a clock signal, and enters said first and second operation modes in accordance with said third and fourth operation modes of the arithmetic circuit in a preceding stage, respectively.

3. The analog-to-digital converter according to claim 1, wherein
    said first and second voltage hold portions of said sample hold portion are formed of first and second capacitors, respectively.

4. The analog-to-digital converter according to claim 3, wherein
    each of said plurality of arithmetic circuits includes:
    a first input node receiving said first or second input voltage,
    a second input node receiving said analog voltage provided from said digital-to-analog sub-converter,
    a switch circuit arranged between said first and second input nodes and said first and second capacitors,
    a first node connected to terminals, on a side not connected to said switch circuit, of said first and second capacitors,
    an amplifier circuit having an input terminal connected to said first node, and
    an output node connected to an output terminal of said amplifier circuit;
    the output terminal of said amplifier circuit is connected to said switch circuit;
    in said first operation mode,
    said switch circuit connects said first input node to said first capacitor, and
    said first capacitor samples and holds said first input voltage;
    in said second operation mode,
    said switch circuit connects said first input node to said second capacitor, and
    said second capacitor samples and holds said second input voltage;
    in said third operation mode,
    said switch circuit connects the output terminal of said amplifier circuit to one of said first and second capacitors, and connects said second input node to the other of said first and second capacitors; and
    in said fourth operation mode,
    said switch circuit connects the output terminal of said amplifier circuit to said other of said first and second capacitors, and connects said second input node to said one of said first and second capacitors.

5. The analog-to-digital converter according to claim 4, wherein
    said switch circuit is formed of:
    a first switch arranged between said first input node and a second node,
    a second switch arranged between said second input node and said second node,
    a third switch arranged between said second node and a third node connected to said first capacitor,
    a fourth switch arranged between said second node and a fourth node connected to said second capacitor, a fifth switch arranged between the output terminal of said amplifier circuit and said third node, and a sixth switch arranged between the output terminal of said amplifier circuit and said fourth node;

in said first operation mode, said first and third switches are turned on;

in said second operation mode, said first and fourth switches are turned on;

in said third operation mode, said second, fourth and fifth switches are turned on; and in said fourth operation mode, said second, third and sixth switches are turned on.

6. The analog to digital converter according to claim 4, wherein said amplifier circuit is formed of a circuit of a differential type, each of said plurality of arithmetic circuits includes an additional switch circuit arranged between the input and output terminals of said amplifier circuit, and in said first and second operation modes, said additional switch circuit electrically connects said output terminal to said input terminal.

* * * * *